United States Patent [19]
Nakagawa et al.

[11] Patent Number: 5,338,647
[45] Date of Patent: Aug. 16, 1994

[54] REFLECTION TYPE PHOTOMASK AND REFLECTION TYPE PHOTOLITHOGRAPHY METHOD COMPRISING A CONCAVO-CONVEX SURFACE

[75] Inventors: Kenji Nakagawa, Isehara; Kenichi Kawashima, Yokohama, both of Japan

[73] Assignee: Fujitsu Limited, Kawasaki, Japan

[21] Appl. No.: 965,086

[22] Filed: Oct. 22, 1992

Related U.S. Application Data

[62] Division of Ser. No. 667,934, Mar. 12, 1991, Pat. No. 5,190,836.

[30] Foreign Application Priority Data

Mar. 16, 1991 [JP] Japan .................. 2-67601

[51] Int. Cl.$^5$ .............................................. G03C 5/00
[52] U.S. Cl. ........................................ 430/322; 430/5
[58] Field of Search .................. 430/5, 22, 269, 321, 430/322, 369

[56] References Cited

U.S. PATENT DOCUMENTS 5,045,417  9/1991  Okamoto .

FOREIGN PATENT DOCUMENTS 0252734   1/1988  European Pat. Off. .
0279670   8/1988  European Pat. Off. .
0395425  10/1990  European Pat. Off. .
0401795  12/1990  European Pat. Off. .
60-83019   5/1985  Japan .

*Primary Examiner*—Steve Rosasco
*Attorney, Agent, or Firm*—Armstrong, Westerman, Hattori, McLeland & Naughton

[57] ABSTRACT

A reflection type photomask includes a substrate, and a reflecting surface formed on the substrate and including a first region and a second region which have a relative height difference. Due to the concavo-convex structure of the reflecting surface, a light reflected from the first region and a light reflected from the second region have a predetermined phase difference which may be used effectively to form a pattern on a photoresist layer.

14 Claims, 7 Drawing Sheets

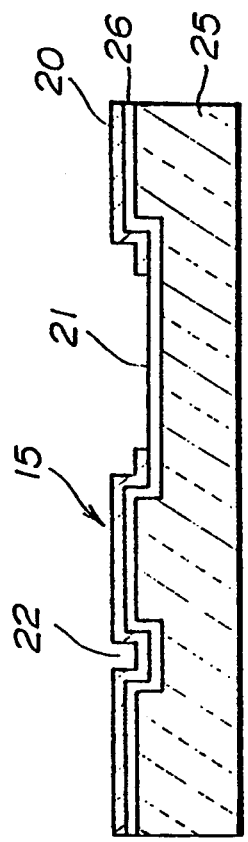
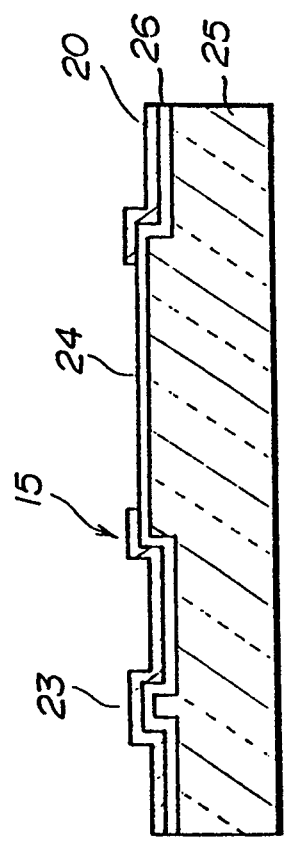
FIG.9A
FIG.9B

REFLECTION TYPE PHOTOMASK AND REFLECTION TYPE PHOTOLITHOGRAPHY METHOD COMPRISING A CONCAVO-CONVEX SURFACE

This is a division of application Ser. No. 07/667,934 filed Mar. 12, 1991 U.S. Pat. No. 5,190,536.

BACKGROUND OF THE INVENTION

The present invention generally relates to photomasks and photolithography methods using photomasks, and more particularly to a reflection type photomask and a reflection type photolithography method which uses the reflection type photomask.

In the field of semiconductor devices, there is a demand to form finer patterns in order to further reduce the size of integrated circuits. In order to form finer patterns, it is necessary to improve the resolution. The resolution is inversely proportional to the numerical aperture and is proportional to the wavelength of the light which is used for the exposure. However, there is a limit to increasing the numerical aperture, and thus, it is necessary to reduce the wavelength of the light in order to improve the resolution. But on the other hand, various restrictions are introduced when the wavelength of the light is reduced.

According to the conventional photolithography technique, a transmission type mask is transferred on a photoresist layer by use of a transmission type lens when forming a pattern. But when the wavelength of the light is reduced in order to improve the resolution, various restrictions are introduced by the material used for the lens and the substrate material of the mask. That is, when the wavelength of the light is gradually reduced in an ultraviolet region, the electron transition region of the material starts and the light transmittance decreases rapidly. In addition, color center or the like is generated by impurities and lattice defect. Furthermore, it is virtually impossible to use a suitable light transmitting material in the far ultraviolet region.

Therefore, according to the conventional transmission type photolithography technique, it is in actual practice impossible use light having a wavelength of approximately 180 nm or less due to the restrictions posed by the transparent material. As a result, the resolution limit of the conventional transmission type photolithography technique is approximately 0.2 to 0.25 μm.

SUMMARY OF THE INVENTION

Accordingly, it is a general object of the present invention to provide a novel and useful reflection type photomask and reflection type photolithography method, in which the problems described above are eliminated.

Another and more specific object of the present invention is to provide a reflection type photomask comprising a substrate, and a reflecting surface formed on the substrate and including a first region and a second region which have a relative height difference, so that a light reflected from the first region and a light reflected from the second region have a predetermined phase difference caused by a difference in lengths of optical paths of the lights which reflect at the first and second regions. According to the photomask of the present invention, the light from the light source is reflected by the reflecting surface, and the wavelength of the light used will not be limited by the transmittance of the material used for the photomask. Hence, it is possible to realize a photolithography using a light having a wavelength of 180 nm or less, and a pattern having a size of 0.2 μm or less can be formed accurately by use of the photomask.

Still another object of the present invention is to provide a photolithography method comprising the steps of irradiating a light from a light source on a reflection type photomask which has a reflecting surface which includes a first region and a second region which have a relative height difference so that a light reflected from the first region and a light reflected from the second region have a predetermined phase difference caused by a difference in lengths of optical paths of the lights which reflect at the first and second regions, imaging the lights reflected from the first and second regions of the photomask onto a photoresist layer which is formed on a wafer by use of an optical system so as to develop a pattern on the photoresist layer, and developing the pattern on the photoresist layer depending on a light intensity of the light imaged thereon. According to the photolithography method of the present invention, the phase of the reflected light is shifted using the concavo-convex reflecting surface of the photomask. Hence, the pattern is formed on the photoresist layer using only the reflected light from the photomask, and the wavelength of the light used will not be limited by the transmittance of the material used for the photomask. Hence, it is possible to realize a photolithography using a light having a wavelength of 180 nm or less, and a pattern having a size of 0.2 μm or less can be formed accurately by use of the photomask.

Other objects and further features of the present invention will be apparent from the following detailed description when read in conjunction with the accompanying drawings.

BRIEF DESCRIPTION OF THE DRAWINGS

FIGS. 9A and 9B respectively are cross sectional views for explaining sixth and seventh embodiments of the reflection type photomask according to the present invention in which the reflection is reduced;

DESCRIPTION OF THE PREFERRED EMBODIMENTS

Figure 1:
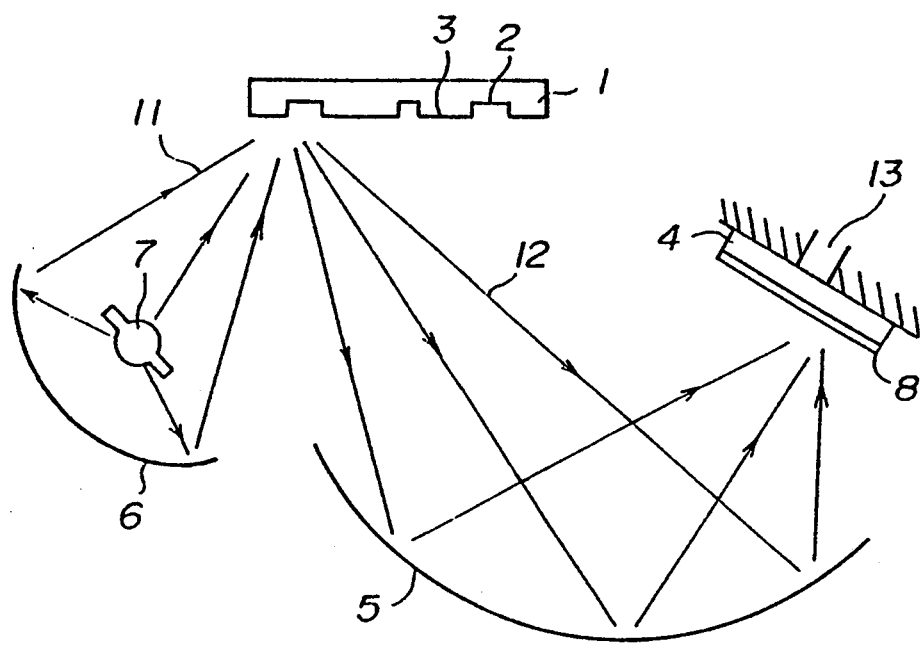
FIG. 1 is a diagram for explaining an embodiment of a reflection type photolithography method according to the present invention.

First, a description will be given of an operating principle of an embodiment of a reflection type photolithography method according to the present invention, by referring to FIG. 1. In FIG. 1, a reflection type photomask 1 has a bottom surface which forms a reflecting surface. The reflecting surface includes a first phase region 2 and a second phase region 3. The first phase region 2 is a concave part relative to the second phase region 3, or the second phase region 3 is a convex part relative to the first phase region 2.

A light emitted from a light source 7 is reflected by an illumination mirror 6, and a reflected light 11 is irradiated on the photomask 1. Because the photomask 1 has the concavo-convex reflecting surface, a reflected light 12 from the reflecting surface includes lights having a phase difference of $\pi$ radians, for example, depending on the concavo-convex structure. The reflected light 12 is reflected and converged by an imaging mirror 5 and is imaged on a photoresist layer 8 which is formed on a substrate (or wafer) 4. The substrate 4 is secured by a support means 13 such as a vacuum chuck. For example, the substrate 4 is made of a semiconductor.

Because of the concavo-convex structure of the reflecting surface, a light which is reflected at the first phase region 2 propagates through an optical path which is longer than a light which is reflected at the second phase region 3. In addition the light reflected at the first phase region has a phase which is delayed compared to the phase of the light reflected at the second phase region 3.

Figure 2A:
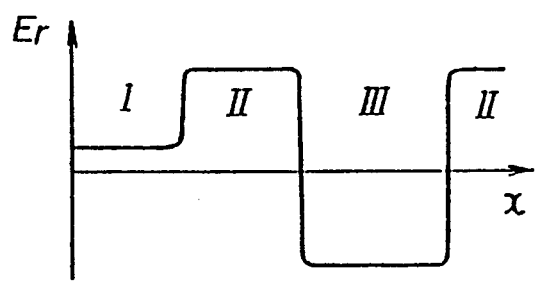
FIGS. 2A and 2B respectively show an amplitude of reflected light and intensity of reflected light for explaining a reflection type photomask shown in FIG. 1.

When the light reflected at the first phase region 2 and the light reflected at the second phase region 3 have a phase difference $\pi$, an amplitude Er of the reflected light has an inverted phase between regions II and III in FIG. 2A. On the other hand, when a non-reflecting region having a low reflectivity is provided on the reflecting surface of the photomask 1, an absolute value of the amplitude Er of the reflected light becomes small as indicated by a region I in FIG. 2A.

Figure 2B:
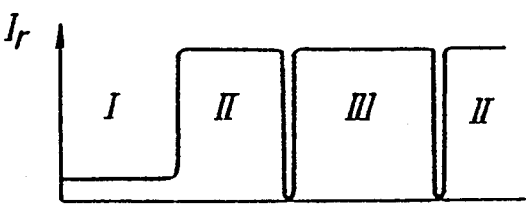

When the photoresist layer 8 is exposed, the photoresist layer 8 senses an intensity Ir of the reflected light which is irradiated thereon. The intensity Ir of the reflected light is proportional to the square of the amplitude Er of the reflected light, and thus, the light intensity distribution becomes as shown in FIG. 2B. In other words, the light intensity Ir is approximately the same in the regions II and III, but the light intensity Ir is zero at the boundary of the two regions II and III. The light intensity Ir at the boundary decreases to an intermediate value if the phase difference between the lights is less than $\pi$.

Accordingly, when lights having mutually different phases are diffracted to mutually interfere, it is possible to reduce the intensity of the reflected light which is irradiated on the photoresist layer 8 on the substrate 4 depending on the amplitude and phase of the lights. When lights having identical amplitude but mutually inverted phases interfere, it is possible to reduce the light intensity of the reflected light to zero. In addition, when the amplitudes of the lights differ, the light intensity of the reflected light differs depending on the amplitudes.

Therefore, it is possible to form bright and dark patterns on an image formation surface by using the photomask which has the concavo-convex reflecting surface.

Next, a more detailed description will be given of the embodiment of the reflection type photolithography method according to the present invention. When the reflected light 11 is incident perpendicularly to the reflecting surface of the photomask 1, it is possible to generate the lights having a phase difference of approximately $\lambda/2$ ($\pi$ radians) by forming the concavo-convex pattern having a height difference of $\lambda/4$, where $\lambda$ denotes the wavelength of the reflected light 11. In FIG. 1, the reflected light 11 is shown incident to the reflecting surface of the photomask 1 with a certain incident angle which is not perpendicular to the reflecting surface so as to facilitate the understanding of the propagation of the reflected lights. It is, however, readily apparent that the height difference of the concavo-convex pattern may be set to obtain the desired phase difference for each incident angle used. It is also possible to generate lights having phase differences of 0, $\pi/2$, $\pi$, $3\pi/4$ and the like by providing the concavo-convex pattern with different heights. When the relative concave first phase region 2 and the relative convex second phase region 3 have the same reflectivity, the light reflected from the first phase region 2 and the light reflected from the second phase region 3 have the same light amplitude.

As described above, the reflected light 12 including the lights having the phase difference is imaged on the photoresist layer 8 on the substrate 4 using the imaging mirror 5. When the reflected light 12 is imaged on the photoresist layer 8, the light reflected from the first phase region 2 and the light reflected from the adjacent second phase region 3 mutually diffract and partially overlap. As a result, light interference occurs and a pattern of the light intensity distribution is generated. In other words, the pattern of the light intensity distribution is generated based on the amplitude and phase of the reflected lights. Accordingly, it is possible to obtain a black-and-white pattern when the photoresist layer 8s developed using a predetermined exposure level as a threshold value. For example, when a positive resist is used for the photoresist layer 8, it is possible to leave as a pattern only a region in which the light intensity falls below a predetermined level.

A heavy hydrogen (or deuterium) lamp, and excimer laser or the like may be used as the light source 7. Particularly, an ArF excimer laser which emits a laser beam having a wavelength of approximately 193 nm or a $F_2$ excimer laser which emits a laser beam having a wavelength of approximately 157 nm is suited as the light source 7. The mirrors 5 and 6 may be formed by polishing a glass substrate into a mirror surface and depositing an Al layer on the mirror surface. Since no chromatic aberration is introduced in the reflection optical system, it is also possible to use light which does not have a single wavelength. For example, it is possible to maintain and utilize the effective interference within a wavelength region of approximately 10% of the wavelengths.

Figure 3A:
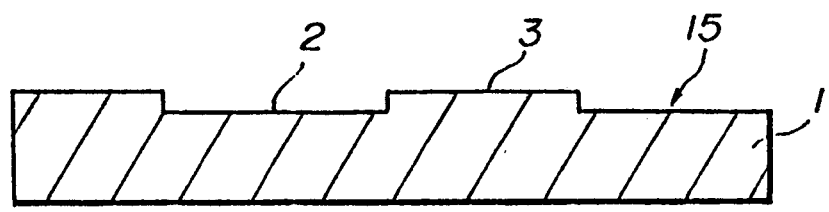
FIGS. 3A and 3B respectively are a cross sectional view and reflected light intensity distribution of a first embodiment of the reflection type photomask according to the present invention.

Next, a description will be given of a first embodiment of a photomask according to the present invention, by referring to FIGS. 3A and 3B. FIG. 3A shows a cross section of the first embodiment of the photomask, and FIG. 3B shows an intensity distribution of reflected light.

In this embodiment, the reflection type photomask 1 has a reflecting surface formed on a top surface thereof. The reflecting surface includes a first phase region 2 which is arranged on a specific plane, and a second phase region 3 which is arranged on a plane which is approximately $\lambda/4$ higher than the specific plane, where $\lambda$ denotes the wavelength of the light used. Because the height difference of the first and second phase regions 2 and 3 is approximately $\lambda/4$, the light reflected by the first phase region 2 has a phase which is delayed by $(\lambda/4) \times 2 = \lambda/2$ compared to the phase of the light reflected by the second phase region 3, assuming that the light is incident approximately perpendicularly to the reflecting surface of the photomask 1. That is, the lights reflected by the first and second phase regions 2 and 3 have a phase difference $\pi$.

Figure 3B:
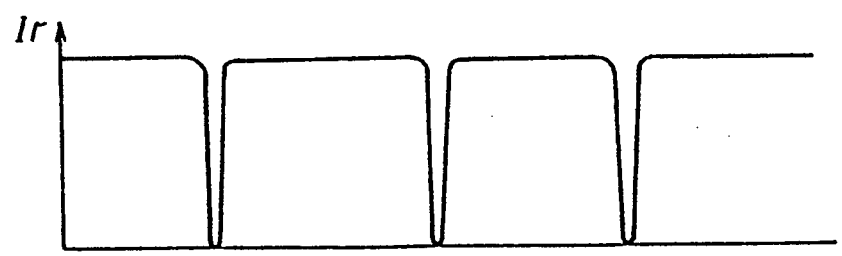

FIG. 3B shows the reflected light intensity distribution which is obtained when the reflected light from the photomask 1 shown in FIG. 3A is imaged on the photoresist layer 8. The lights having the phase difference $\pi$ are mixed at a boundary of the first and second phase regions 2 and 3, and as a result, a position where the reflected light intensity becomes zero is introduced. Hence, by using the lights having the same amplitude but mutually inverted phases, it becomes possible to form an extremely narrow black pattern, that is, a region in which the light intensity is zero or extremely small. Such a black pattern remains after developing the photoresist layer 8 which is made of a positive resist.

Next, a description will be given of methods of forming the second embodiment of the photomask according to the present invention, by referring to FIGS. 4A and 4B.

Figure 4A:
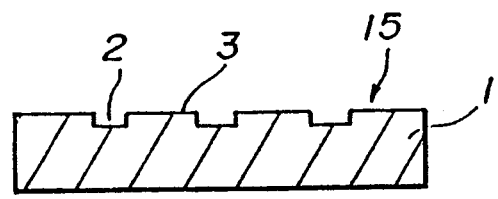
FIGS. 4A and 4B respectively are cross sectional views for explaining a case where a metal substrate is used for the photomask and a case where a quartz substrate is used for the photomask.

FIG. 4A shows a case where a substrate of the photomask 1 is made of a metal having a high reflectivity with respect to the wavelength of the light used, and a reflecting surface 15 is formed by polishing a top surface of the metal substrate to a mirror finish. This reflecting surface 15 is covered by a photoresist layer or the like and a mask pattern is formed. Then, an etching is made to etch the mirror surface 15 to a depth of approximately $\lambda/4$ so as to form the first phase region 2, and the mask pattern is thereafter removed. As a result, it is possible to form the concavo-convex pattern on the reflecting surface 15, that is, the first and second phase regions 2 and 3. Measures must be taken so that the etched surface has a mirror finish and the first and second phase regions 2 and 3 have approximately the same reflectivity.

Figure 4B:
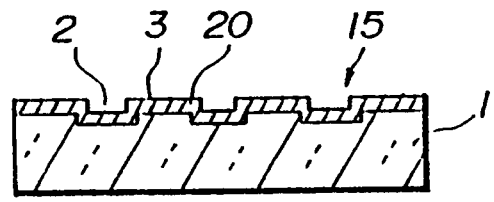

FIG. 4B shows a case where the substrate of the photomask 1 is made of a crystal having a top surface which is polished to a mirror finish. The concavo-convex pattern is formed on the crystal substrate, similarly as in the case of the metal substrate shown in FIG. 4A.

Thereafter, a metal reflecting layer 20 having a high reflectivity is deposited on the concavo-convex surface of the crystal substrate by a vapor deposition, plating or the like so as to form the reflecting surface 15. As a result, the first and second phase regions 2 and 3 are formed on the metal reflecting layer 20.

Figure 5A:
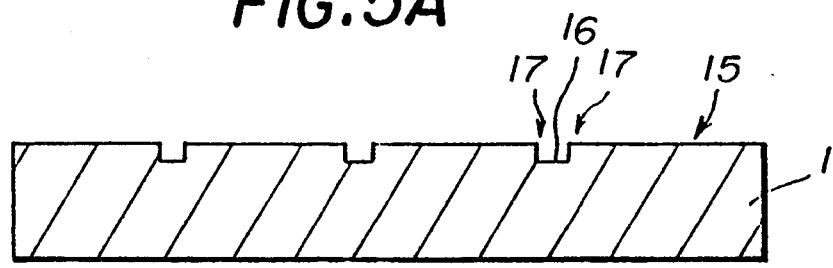
FIGS. 5A and 5B respectively are a cross sectional view and reflected light intensity distribution of a second embodiment of the reflection type photomask according to the present invention.
Figure 5B:
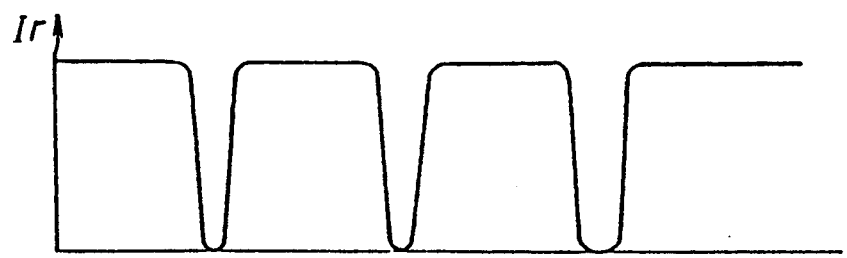

Next, a description will be given of a second embodiment of the photomask according to the present invention, by referring to FIGS. 5A and 5B. FIG. 5A shows a cross section of the second embodiment of the photomask, and FIG. 5B shows an intensity distribution of reflected light.

In this embodiment, the photomask 1 has a narrow groove 16 formed in the reflecting surface 15. The width of the groove 16 is set within a range such that the light intensity change caused by the interference at side edges 17 on both sides of the groove 16 mutually overlap on the imaging plane. In other words, the width of the groove 16 is set so that two black patterns on the imaging plane corresponding to the two side edges 17 overlap and may only be recognized as a single black pattern. Accordingly, the light intensity does not become large in a region in which the light reflected by the bottom surface of the groove 16 is imaged, and a black pattern having a low light intensity is formed at a position corresponding to the groove 16.

Figure 6A:
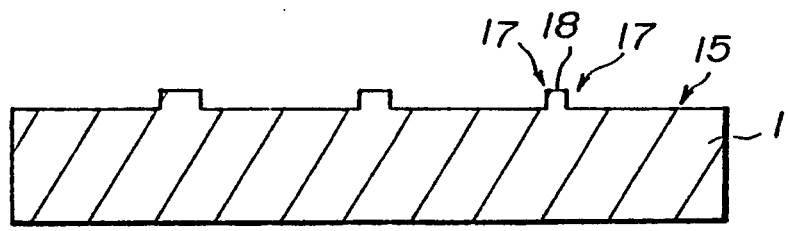
FIGS. 6A and 6B respectively are a cross sectional view and reflected light intensity distribution of a third embodiment of the reflection type photomask according to the present invention.
Figure 6B:
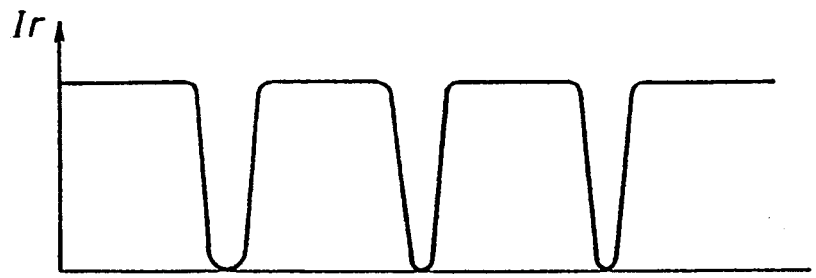

Next, a description will be given of a third embodiment of the photomask according to the present invention, by referring to FIGS. 6A and 6B. FIG. 6A shows a cross section of the third embodiment of the photomask, and FIG. 6B shows an intensity distribution of reflected light.

In this embodiment, the photomask 1 has a narrow projection 18 formed on the reflecting surface 15. The width of the projection 18 is set within a range such that the light intensity change caused by the interference at side edges 17 on both sides of the projection 18 mutually overlap on the imaging plane. In other words, the width of the projection 18 is set so that two black patterns on the imaging plane corresponding to the two side edges 17 overlap and may only be recognized as a single black pattern. Accordingly, the light intensity does not become large in a region in which the light reflected by the top surface of the projection 18 is imaged, and a black pattern having a low light intensity is formed at a position corresponding to the projection 18.

Of course, it is possible to combine the structures shown in FIGS. 5A and 6A. In other words, it is possible to form a groove having a depth of approximately $\lambda/4$ from a reference surface and a projection having a height of approximately $\lambda/4$ from the reference surface.

In addition, the lights reflected from the reflecting surface 15 of the photomask 1 need not necessarily have the phase difference $\pi$. In other words, the groove or projection may be formed on the reflecting surface 15 so that the reflected lights have a phase difference other than $\pi$ such as $\pi/2$ and $3\pi/4$. Such an intermediate phase difference is especially suited for forming an open figure when forming a black pattern at a boundary of a region in which the phase difference is $\pi$ as shown in FIGS. 3A and 3B.

Figure 7A:
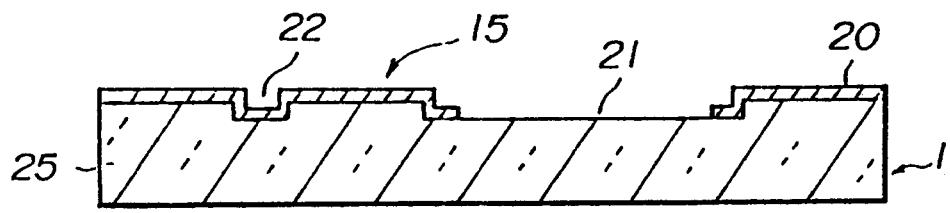
FIGS. 7A and 7B respectively are a cross sectional view and reflected light intensity distribution of a fourth embodiment of the reflection type photomask according to the present invention.

Next, a description will be given of a fourth embodiment of the photomask according to the present invention, by referring to FIGS. 7A and 7B. FIG. 7A shows a cross section of the fourth embodiment of the photomask, and FIG. 7B shows an intensity distribution of reflected light.

In this embodiment, a substrate 25 of the photomask 1 is made of a material such as crystal and transmits light. A concavo-convex pattern is formed on a top surface of the substrate 25. A reflecting layer 20 is formed partially on the concavo-convex pattern to form the reflecting surface 15. A wide concave region 21 is formed in the reflecting surface 15, and the reflecting layer 20 is formed on the reflecting surface 15 at only a peripheral part of the concave region 21 and the surface of the substrate 25 is exposed at a central part of the concave region 21. In other words, the central part of the concave region 21 forms a non-reflecting region. The width of the reflecting layer 20 at the peripheral part of the concave region 21 is limited to a width such that a white pattern having a large light intensity is not formed on the image forming plane. When the light is incident to the reflecting surface 15 shown in FIG. 7A, the light is strongly reflected in the region in which the reflecting layer 20 is provided and is substantially not reflected in the region in which no reflecting layer 20 is provided.

Figure 7B:
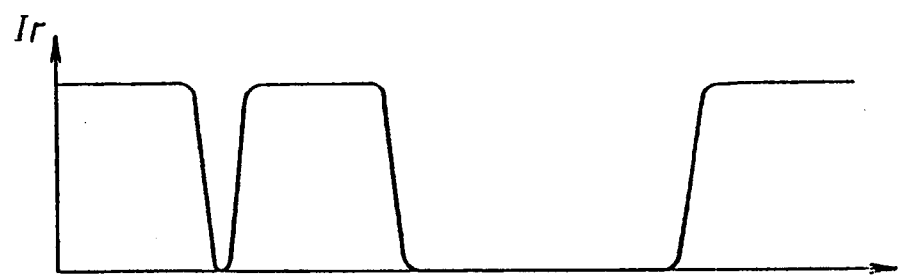

As shown in FIG. 7B, the reflected light intensity decreases in a region which corresponds to a narrow groove 22 shown in FIG. 7A. In addition, the reflected light intensity decreases in a region which corresponds to the concave region 21 which has the relatively large area because the reflecting layer 20 is formed only in the peripheral part of the concave region 21 and the reflected lights of mutually inverted phases interfere. Since the reflecting layer 20 does not exist on the inner side of the peripheral part of the concave region 21, no reflected light exists and the reflected light intensity is maintained low.

Accordingly, a non-reflecting surface is formed to prevent the generation of the reflected light itself for a region which is wider than a predetermined width when forming a relatively wide black pattern, that is, a pattern having a low reflected light intensity.

Figure 8A:
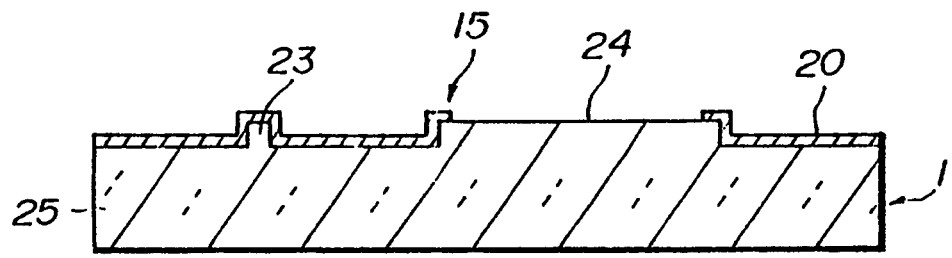
FIGS. 8A and 8B respectively are a cross sectional view and reflected light intensity distribution of a fifth embodiment of the reflection type photomask according to the present invention.

Next, a description will be given of a fifth embodiment of the photomask according to the present invention, by referring to FIG. 8A and 8B. FIG. 8A shows a cross section of the fifth embodiment of the photomask, and FIG. 8B shows an intensity distribution of reflected light.

In this embodiment, the substrate 25 of the photomask 1 is made of a material such as crystal and transmits light. A concavo-convex pattern is formed on a top surface of the substrate 25. The reflecting layer 20 is formed partially on the concavo-convex pattern to form the reflecting surface 15. A wide convex region 24 is formed on the reflecting surface 15 at a position corresponding to that of the wide concave region 21 shown in FIG. 7A, and the reflecting layer 20 is formed on the reflecting surface 15 at only a peripheral part of the convex region 24 and the surface of the substrate 25 is exposed at a central part of the convex region 24. In other words, the central part of the convex region 24 forms a non-reflecting region. The width of the reflecting layer 20 at the peripheral part of the convex region 24 is limited to a width such that a white pattern having a large light intensity is not formed on the image forming plane. When the light is incident to the reflecting surface 15 shown in FIG. 8A, the light is strongly reflected in the region in which the reflecting layer 20 is provided and is substantially not reflected in the region in which no reflecting layer 20 is provided.

Figure 8B:
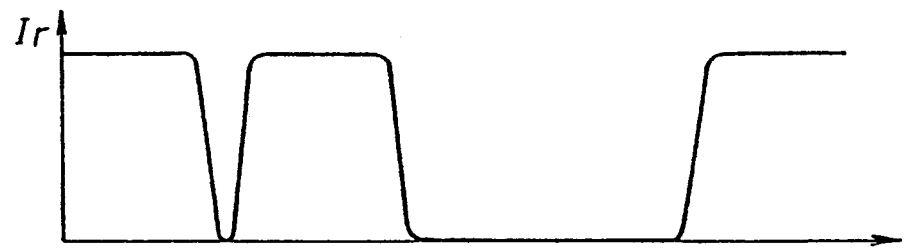

As shown in FIG. 8B, the reflected light intensity decreases in a region which corresponds to a narrow projection 23 shown in FIG. 8A. In addition, the reflected light intensity decreases in a region which corresponds to the convex region 24 which has the relatively large area because the reflecting layer 20 is formed only in the peripheral part of the convex region 24 and the reflected lights of mutually inverted phases interfere. Since the reflecting layer 20 does not exist on the inner side of the peripheral part of the convex region 24, no reflected light exists and the reflected light intensity is maintained low.

Accordingly, a non-reflecting surface is formed to prevent the generation of the reflected light itself for a region which is wider than a predetermined width when forming a relatively wide black pattern, that is, a pattern having a low reflected light intensity.

Therefore, the photomask 1 shown in FIG. 7A and the photomask 1 shown in FIG. 8A have essentially the same functions. Of course, it is possible to combine the structures of FIGS. 7A and 8A.

In the embodiments shown in FIGS. 7A and 8A, the non-reflecting surface is formed by exposing the substrate surface. However, when the substrate 25 is made of a transparent material, the substrate surface usually has a certain reflectivity and a slight reflection occurs. Hence, it is possible to reduce the reflection at the substrate surface by forming a reflection preventing layer.

Next, a description will be given of sixth and seventh embodiments of the photomask according to the present invention, by referring to FIGS. 9A and 9B. FIG. 9A shows a cross section of the sixth embodiment of the photomask, and FIG. 9B shows a cross section of the seventh embodiment of the photomask. In FIGS. 9A and 9B, those parts which are the same as those corresponding parts in FIGS. 7A and 8A are designated by the same reference numerals, and a description thereof will be omitted.

In the sixth embodiment shown in FIG. 9A, the substrate 25 of the photomask 1 is made of a material which is transparent with respect to the wavelength of the light which is used. A concavo-convex pattern is formed on a top surface of the substrate 25. The depth of the concave region or the height of the convex region is $\lambda/4$. A reflection preventing layer 26 having a thickness $\lambda/4$ is formed on the concavo-convex pattern. The reflection preventing layer 26 is made of a material having an intermediate refractive index between the refractive index of air or vacuum. The refractive index of the material used for the reflection preventing layer 26 is desirably close to a value $X^{\frac{1}{2}}$, where X denotes the refractive index of the substrate 25. For example, when the substrate 25 is made of crystal, the reflection preventing layer 26 is made of $MgF_2$.

The reflection preventing layer 26 may have a multi-layer structure having three, five or more layers, for example. In this case, the refractive index of each layer of the multi-layer structure is selected so as to minimize the reflection from the reflection preventing layer 26.

The reflecting layer 20 is formed partially on the concavo-convex pattern of the reflection preventing layer 26 to form the reflecting surface 15. For example, the reflecting layer 20 is made of a metal having a high reflectivity. The wide concave region 21 is formed in the reflecting surface 15, and the reflecting layer 20 is formed on the reflecting surface 15 at only a peripheral part of the concave region 21 and the surface of the reflection preventing layer 26 is exposed at a central part of the concave region 21. For example, the reflecting layer 20 may be formed on the entire surface of the reflection preventing layer 26 and the reflecting layer 20 at the central part of the concave region 21 may be removed by an etching. In other words, the central part of the concave region 21 forms a non-reflecting region.

The seventh embodiment shown in FIG. 9B is basically the same as the sixth embodiment shown in FIG. 9A, except that the convex region 24 is provided in place of the concave region 21.

According to the sixth and seventh embodiments, the reflected light from the substrate 25 and the reflected light from the surface of the reflection preventing layer 26 cancel each other, thereby reducing the reflected light.

Figure 10A:
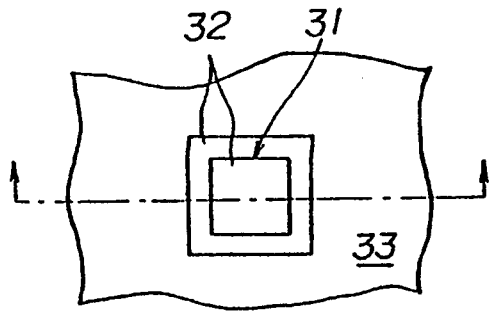
FIGS. 10A and 10B respectively are a plan view and a cross sectional view of a photomask for forming a contact hole.

Next, a description will be given of a first pattern of a semiconductor device formed by the reflection type photomask according to the present invention, by referring to FIGS. 10A through 10C. FIGS. 10A and 10B respectively show the plan view and cross sectional view of the photomask, and FIG. 10C shows the plan view of the first pattern which is formed.

In FIGS. 10A and 10B, a rectangular projection 31 is formed on a surface of a crystal substrate 33. A reflecting layer 32 made of Al covers the projection 31 and a peripheral region of the projection 31. The peripheral region has a predetermined width.

Figure 10C:
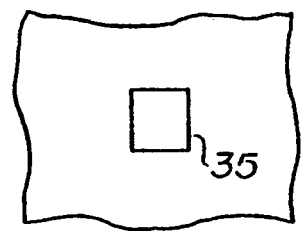
FIG. 10C is a plan view showing a developed pattern obtained by use of the photomask shown in FIGS. 9A and 9B.
Figure 10B:
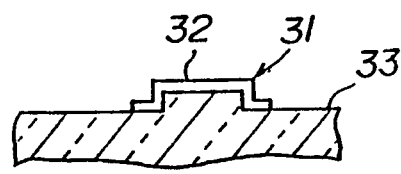

When the photomask shown in FIGS. 10A and 10B is used to develop a photoresist layer using a reflected light, the first pattern shown in FIG. 10C is obtained. This first pattern is a contact hole. The intensity of the reflected light obtained from the reflecting layer 32 at the central part of the projection 31 is large, but the intensity of the reflected light from the reflecting layer 32 at other parts is low because the reflected light from the peripheral part of the projection 31 and the the reflected light from the reflecting layer 32 on the substrate surface mutually interfere. For this reason, a rectangular white pattern 35, that is, a region in which the reflected light intensity is large), is obtained at a part corresponding to the central part of the projection 31. On the other hand, a black pattern, that is, a region in which the reflected light intensity is low, is obtained at the peripheral part of the projection 31 because reflected light does exist but the intensity of the reflected light is low due to the mutual interference. In addition, a black pattern is also obtained at a part corresponding to the part where the substrate surface is exposed because the reflected light intensity itself is low at this part.

Figure 11A:
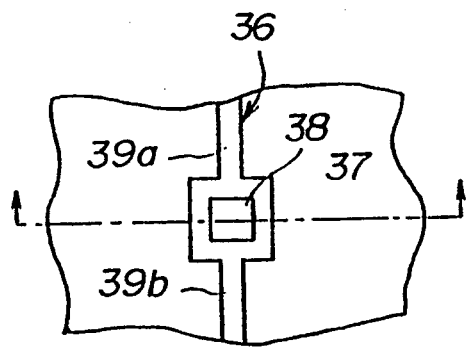
FIGS. 11A and 11B respectively are a plan view and a cross sectional view of a photomask for forming a metal interconnection pattern.

Next, a description will be given of a second pattern of a semiconductor device formed by the reflection type photomask according to the present invention, by referring to FIGS. 11A through 11C. FIGS. 11A and 11B respectively show the plan view and cross sectional view of the photomask, and FIG. 11C shows the plan view of the second pattern which is formed.

In FIGS. 11A and 11B, a rectangular projection 36 is formed on a surface of a crystal substrate 38. A reflecting layer 37 made of Al covers a peripheral part of the projection 36 and the substrate surface. The substrate surface is exposed at only a central part of the projection 36.

Figure 11C:
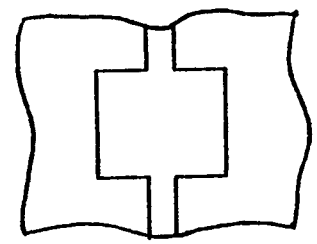
FIG. 11C is a plan view showing a developed pattern obtained by use of the photomask shown in FIGS. 11A and 11B.
Figure 11B:
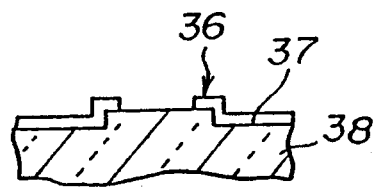

When the photomask shown in FIGS. 11A and 11B is used to develop a photoresist layer using a reflected light, the second pattern shown in FIG. 11C is obtained. This second pattern is a metal interconnection pattern. At a narrow pattern 39a or 39b shown in FIG. 11A, the reflected light from the lower surface of the reflecting layer 37 on both sides of the narrow pattern 39a or 39b and the reflected light from the higher surface of the reflecting layer 37 interfere, thereby decreasing the reflected light intensity and forming one black pattern. In addition, a black pattern is similarly formed at the peripheral part of the projection 36 due to interference, and a black pattern is formed at the central part of the projection 36 since the substrate surface is exposed and the reflected light itself is reduced at the central part.

As may be understood from the embodiments described above, the present invention is particularly effective for the photolithography using a far ultraviolet light which has a wavelength of 200 nm or less. However, it is of course possible to employ the present invention for the photolithography using a light which has a longer wavelength.

Figure 12A:
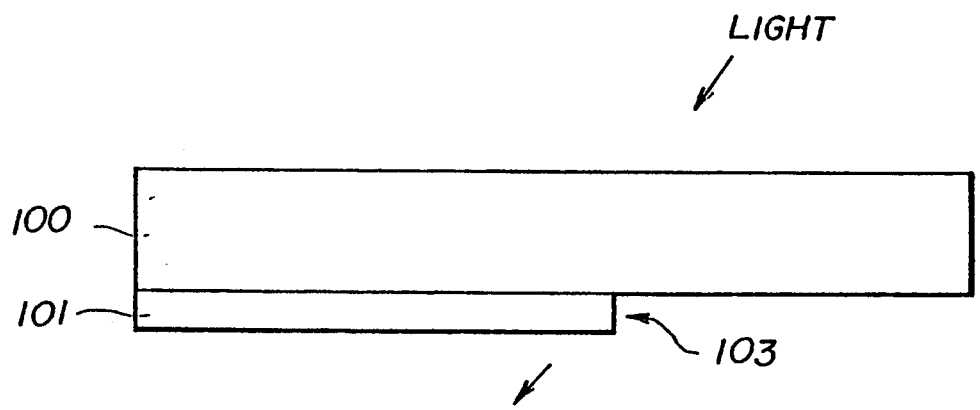
FIGS. 12A and 12B are cross sectional views for explaining the effects of the present invention.

A transmission type photomask utilizing the phase shift of transmitted lights was previously proposed in a U.S. patent application Ser. No. 516,347 filed Apr. 27, 1990. FIG. 12A shows a cross section of the proposed photomask having a transparent substrate 100 and a phase shift layer 101. In order to obtain the phase shift $\pi$ between the light transmitted through only the substrate 100 and the light transmitted through the substrate 100 and the phase shift layer 101 for an i-ray, for example, the phase shift layer 101 must have a thickness of 390 nm. However, when the phase shift layer 101 is relatively thick, unwanted reflections occur at an edge part 103 of the phase shift layer 101 and it becomes difficult to form fine and accurate patterns.

Figure 12B:
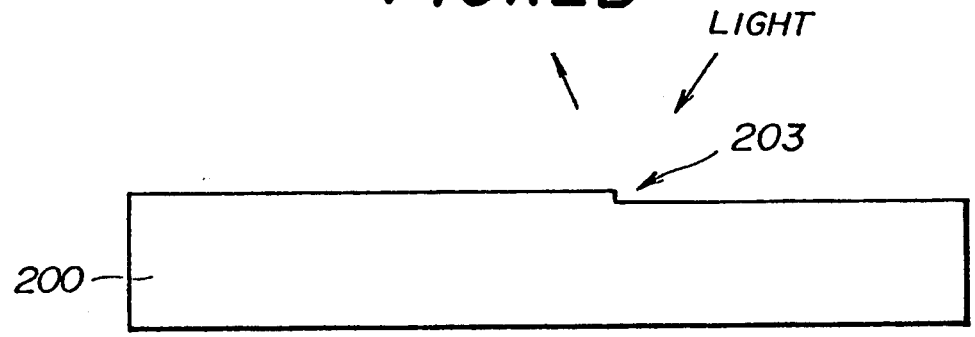

On the other hand, since the present invention utilizes the photomask shown in FIG. 12B having a substrate 200 having a concavo-convex reflecting surface, the height difference between the concave region and the convex region of the reflecting surface 200 only needs to be 91 nm in order to obtain the phase shift $\pi$ between the light reflected at the concave region and the light reflected at the convex region for the i-ray. Hence, compared to the transmission type photomask shown in FIG. 12A, unwanted reflections which occur at an edge part 203 of the substrate 200 virtually negligible and it becomes possible to form fine and accurate patterns. Therefore, when the light having a wavelength of 180 nm or less is used, it possible to accurately form a pattern which has a size of 0.2 $\mu$m or less.

Further, the present invention is not limited to these embodiments, but various variations and modifications may be made without departing from the scope of the present invention.

What is claimed is:

1. A photolithography method comprising the steps of:
   irradiating a light from a light source on a reflection type photomask which has a concavo-convex reflecting surface which includes a first region and a second region which have a relative height difference so that a light reflected from the first region and a light reflected from the second region have a predetermined phase difference caused by a difference in lengths of optical paths of the lights which reflect at the first and second regions;
   imaging the lights reflected from the first and second regions of the photomask onto a photoresist layer which is formed on a wafer by use of an optical system so as to develop a pattern on the photoresist layer; and
   developing the pattern on the photoresist layer depending on a light intensity of the light imaged thereon.

2. The photolithography method as claimed in claim 1, wherein the light from the light source is obtained via a mirror which reflects the light emitted from the light source, and the optical system includes a mirror which reflects and images the lights reflected from the first and second regions of the photomask onto the photoresist layer.

3. The photolithography method as claimed in claim 1, wherein the photomask includes a substrate which has a concavo-convex substrate surface, and a reflecting layer which is formed on the substrate surface and has a surface which forms the reflecting surface.

4. The photolithography method as claimed in claim 3, wherein the substrate is made of a material which is transparent with respect to the light which is irradiated on the reflecting surface.

5. The photolithography method as claimed in claim 4, wherein the first region includes a concave part formed in the substrate, and the reflecting layer is formed on the substrate surface excluding a central part of the concave part.

6. The photolithography method as claimed in claim 4, wherein the second region includes a convex part formed on the substrate, and the reflecting layer is formed on the substrate surface excluding a central part of the convex part.

7. The photolithography method as claimed in claim 1, wherein at least one of the first and second regions has such a width that an interference pattern generated by a light reflected at one end of the first and/or second region approximately overlaps an interference pattern generated by a light reflected at the other end of the first and/or second region on the photoresist layer.

8. The photolithography method as claimed in claim 1, wherein the photomask includes a substrate which has a concavo-convex substrate surface, a reflection preventing layer which is formed on the substrate surface and a reflecting layer which is formed on at least a part of the reflection preventing layer and has a surface which forms the reflecting surface.

9. The photolithography method as claimed in claim 8, wherein the substrate is made of a material which is transparent with respect to the light which is irradiated on said reflecting surface.

10. The photolithography method as claimed in claim 9, wherein the first region includes a concave part formed in the substrate, and the reflecting layer is formed on the reflection preventing layer excluding a central part of the concave part.

11. The photolithography method as claimed in claim 9, wherein the second region includes a convex part formed on the substrate, and the reflecting layer is formed on the reflection preventing layer excluding a central part of the convex part.

12. The photolithography method as claimed in claim 1, wherein the photomask further includes a third region formed in a central part of one of the first and second regions, said first and second regions having a large reflectivity compared to a reflectivity of said third region.

13. The photolithography method as claimed in claim 1, wherein the photomask includes a substrate which is made of a metal and has a concavo-convex substrate surface, and said reflecting surface is the substrate surface.

14. A photolithography method comprising the steps of:
    irradiating a light from a light source on a reflection type photomask which has a substrate having a concavo-convex substrate surface and a reflecting surface formed on at least part of the concavo-convex substrate surface and having a concavo-convex reflecting surface which includes a first region and a second region which have a relative height difference so that a light reflected from the first region and a light reflected from the second region have a predetermined phase difference caused by a difference in lengths of optical paths of the lights which reflect at the first and second regions;
    imaging the lights reflected from the first and second regions of the photomask onto a photoresist layer which is formed on a wafer by use of an optical system so as to develop a pattern on the photoresist layer; and
    developing the pattern on the photoresist layer depending on a light intensity of the light imaged thereon.

* * * * *

UNITED STATES PATENT AND TRADEMARK OFFICE
CERTIFICATE OF CORRECTION

PATENT NO. : 5,338,647
DATED : August 16, 1994
INVENTOR(S) : NAKAGAWA et al.

It is certified that error appears in the above-indentified patent and that said Letters Patent is hereby corrected as shown below:

On the cover page, Item [30], "Mar. 16, 1991" should read --Mar. 16, 1990--.

Signed and Sealed this

Fifteenth Day of November, 1994

Attest:

BRUCE LEHMAN

*Attesting Officer*      *Commissioner of Patents and Trademarks*